United States Patent
Koshika et al.

(10) Patent No.: US 11,888,090 B2
(45) Date of Patent: Jan. 30, 2024

(54) SEMICONDUCTOR LIGHT-EMITTING ELEMENT AND METHOD OF PRODUCING SEMICONDUCTOR LIGHT-EMITTING ELEMENT

(71) Applicant: DOWA Electronics Materials Co., Ltd., Tokyo (JP)

(72) Inventors: Yuta Koshika, Akita (JP); Yoshitaka Kadowaki, Akita (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 458 days.

(21) Appl. No.: 17/418,849

(22) PCT Filed: Dec. 12, 2019

(86) PCT No.: PCT/JP2019/048778
§ 371 (c)(1),
(2) Date: Jun. 28, 2021

(87) PCT Pub. No.: WO2020/145025
PCT Pub. Date: Jul. 16, 2020

(65) Prior Publication Data
US 2022/0059721 A1 Feb. 24, 2022

(30) Foreign Application Priority Data
Jan. 7, 2019 (JP) ................. 2019-000854

(51) Int. Cl.
H01L 33/06 (2010.01)
H01L 33/00 (2010.01)
H01L 33/30 (2010.01)

(52) U.S. Cl.
CPC .......... H01L 33/06 (2013.01); H01L 33/0062 (2013.01); H01L 33/30 (2013.01)

(58) Field of Classification Search
CPC ..... H01L 33/06; H01L 33/0062; H01L 33/32; H01L 21/02392; H01L 21/02461;
(Continued)

(56) References Cited

U.S. PATENT DOCUMENTS

| 5,625,635 A | 4/1997 | Kurtz et al. |
| 10,374,120 B2 * | 8/2019 | Atwater, Jr. .......... H01L 31/184 |
| 2006/0102933 A1 * | 5/2006 | Yamamoto .......... H01L 33/0093 257/200 |

FOREIGN PATENT DOCUMENTS

| JP | H0541564 A | 2/1993 |
| JP | H07147454 A | 6/1995 |

(Continued)

OTHER PUBLICATIONS

Mar. 10, 2020, International Search Report issued in the International Patent Application No. PCT/JP2019/048778.
(Continued)

*Primary Examiner* — Shahed Ahmed
(74) *Attorney, Agent, or Firm* — KENJA IP LAW PC

(57) ABSTRACT

Provided is a semiconductor light-emitting element having improved light emission output. The semiconductor light-emitting element includes a light-emitting layer having a layered structure in which a first III-V compound semiconductor layer and a second III-V compound semiconductor layer having different composition ratios are repeatedly stacked. The first and second III-V compound semiconductor layers each contain three or more types of elements that are selected from Al, Ga, and In and from As, Sb, and P. The composition wavelength difference between the composition wavelength of the first III-V compound semiconductor layer and the composition wavelength of the second III-V compound semiconductor layer is 50 nm or less. The ratio of the lattice constant difference between the lattice constant of the first III-V compound semiconductor layer and the lattice
(Continued)

constant of the second III-V compound semiconductor layer is not less than 0.05% and not more than 0.60%.

9 Claims, 3 Drawing Sheets

(58) Field of Classification Search
    CPC ......... H01L 21/02463; H01L 21/02543; H01L 21/02546; H01L 21/0262; H01L 33/00–648; H01L 27/15–156; H01L 2933/00–0091; H01L 33/30–325; H01L 33/0025; H01L 33/002; C23C 16/301
    See application file for complete search history.

(56) References Cited

FOREIGN PATENT DOCUMENTS

| JP | H1168153 A | 3/1999 |
|---|---|---|
| JP | 2002026455 A | 1/2002 |
| JP | 2007184585 A | 7/2007 |
| JP | 2007519244 A | 7/2007 |
| JP | 2008066326 A | 3/2008 |
| JP | 2012256811 A | 12/2012 |
| JP | 2013165261 A | 8/2013 |
| JP | 2018006495 A | 1/2018 |
| JP | 2018101675 A | 6/2018 |

OTHER PUBLICATIONS

Oct. 5, 2020, Office Action issued by the Taiwan Intellectual Property Office in the corresponding Taiwanese Patent Application No. 108147132.

Jun. 16, 2021, International Preliminary Report on Patentability issued in the International Patent Application No. PCT/JP2019/048778.

* cited by examiner

SEMICONDUCTOR LIGHT-EMITTING ELEMENT AND METHOD OF PRODUCING SEMICONDUCTOR LIGHT-EMITTING ELEMENT

TECHNICAL FIELD

The present disclosure relates to a semiconductor light-emitting element and a method of producing a semiconductor light-emitting element.

BACKGROUND

III-V compound semiconductors such as InGaAsP are used as semiconductor materials of semiconductor layers in semiconductor light-emitting elements. Through composition ratio adjustment of a light-emitting layer formed using a III-V compound semiconductor material, it is possible to adjust the light emission wavelength of a semiconductor light-emitting element over a wide range from green to infrared. For example, semiconductor light-emitting elements that are infrared-emitting with a light emission wavelength in an infrared region of wavelengths of 750 nm or more are widely used in applications such as sensors, gas analysis, and surveillance cameras.

Numerous attempts have been made to enhance the characteristics of semiconductor light-emitting elements. In one example, Patent Literature (PTL) 1 focuses on the lattice constant difference between layers in a light-emitting layer having a layered structure in which are a plurality of III-V compound semiconductor layers are stacked.

PTL 1 uses a light-emitting layer having a quantum well structure formed of InGaAsP quaternary compound semiconductor layers. In PTL 1, the composition ratios of the well layers are altered so as to adjust a lattice constant difference and cause quantum well straining, and to thereby enable increased output and the like in accompaniment to this strain. Note that the composition ratios of the well layers in PTL 1 are adjusted such that the light emission transition wavelengths are equal.

CITATION LIST

Patent Literature

PTL 1: JP H7-147454 A

SUMMARY

Technical Problem

Applications for semiconductor light-emitting elements have been expanding further and further in recent years. Consequently, there is demand for techniques that can further improve the light emission output of semiconductor light-emitting elements in which III-V compound semiconductors are used as light-emitting layer materials.

Accordingly, one object of the present disclosure is to provide a semiconductor light-emitting element having improved light emission output. Another object of the present disclosure is to provide a method of producing this semiconductor light-emitting element.

Solution to Problem

As a result of extensive studies performed diligently to solve the problem set forth above, the inventors decided to focus on the composition wavelength difference and the lattice constant difference between layers in a light-emitting layer having a layered structure in which first and second III-V compound semiconductor layers are stacked. The inventors found that the light emission output of a semiconductor light-emitting element can be improved by adopting a layered structure in which the composition wavelength difference is reduced while also providing a lattice constant difference that is within an appropriate range. The present disclosure was completed based on the finding described above and has the following primary features.

(1) A semiconductor light-emitting element comprising a light-emitting layer having a layered structure in which a first III-V compound semiconductor layer and a second III-V compound semiconductor layer having different composition ratios are stacked repeatedly, wherein group III element in the first III-V compound semiconductor layer and the second III-V compound semiconductor layer is one type or two or more types selected from the group consisting of Al, Ga, and In, and group V element in the first III-V compound semiconductor layer and the second III-V compound semiconductor layer is one type or two or more types selected from the group consisting of As, Sb, and P, the first III-V compound semiconductor layer and the second III-V compound semiconductor layer each contain three or more types of elements selected from the group III element and the group V element, and a composition wavelength difference between a composition wavelength of the first III-V compound semiconductor layer and a composition wavelength of the second III-V compound semiconductor layer is 50 nm or less, and a ratio of a lattice constant difference between a lattice constant of the first III-V compound semiconductor layer and a lattice constant of the second III-V compound semiconductor layer is not less than 0.05% and not more than 0.60%.

(2) The semiconductor light-emitting element according to the foregoing (1), wherein the ratio of the lattice constant difference is 0.3% or more.

(3) The semiconductor light-emitting element according to the foregoing (1) or (2), wherein the composition wavelength difference between the first III-V compound semiconductor layer and the second III-V compound semiconductor layer is 30 nm or less.

(4) The semiconductor light-emitting element according to any one of the foregoing (1) to (3), wherein the first III-V compound semiconductor layer and the second III-V compound semiconductor layer each contain four or more types of elements selected from the group III element and the group V element.

(5) The semiconductor light-emitting element according to the foregoing (4), wherein among elements constituting the four or more types of elements, the group III element is Ga and In and the group V element is two or more types selected from the group consisting of As, Sb, and P.

(6) The semiconductor light-emitting element according to any one of the foregoing (1) to (3), wherein the first III-V compound semiconductor layer and the second III-V compound semiconductor layer are each an InGaAsP quaternary compound semiconductor.

(7) The semiconductor light-emitting element according to any one of the foregoing (1) to (6), wherein a third III-V compound semiconductor layer is further included between the first III-V compound semiconductor layer and the second III-V compound semiconductor layer in the layered structure of the light-emitting layer, the third III-V compound semiconductor layer contains four or more types of elements selected from the group III element and the group V element, each composition wavelength difference between adjacent layers among the first III-V compound semiconductor layer, the second III-V compound semiconductor layer, and the third III-V compound semiconductor layer is 50 nm or less, and each ratio of a lattice constant difference between adjacent layers among the first III-V compound semiconductor layer, the second III-V compound semiconductor layer, and the third III-V compound semiconductor layer is not less than 0.05% and not more than 0.60%.

(8) The semiconductor light-emitting element according to the foregoing (7), wherein the third III-V compound semiconductor layer is an InGaAsP quaternary compound semiconductor.

(9) A method of producing the semiconductor light-emitting element according to any one of the foregoing (1) to (8), comprising:

a first step of forming the first III-V compound semiconductor layer;

a second step of forming the second III-V compound semiconductor layer; and a light-emitting layer formation step of repeatedly performing the first step and the second step to form the light-emitting layer.

Advantageous Effect

According to the present disclosure, it is possible to provide a semiconductor light-emitting element having improved light emission output. Moreover, according to the present disclosure, it is possible to provide a method of producing this semiconductor light-emitting element.

DETAILED DESCRIPTION

Figure 1:
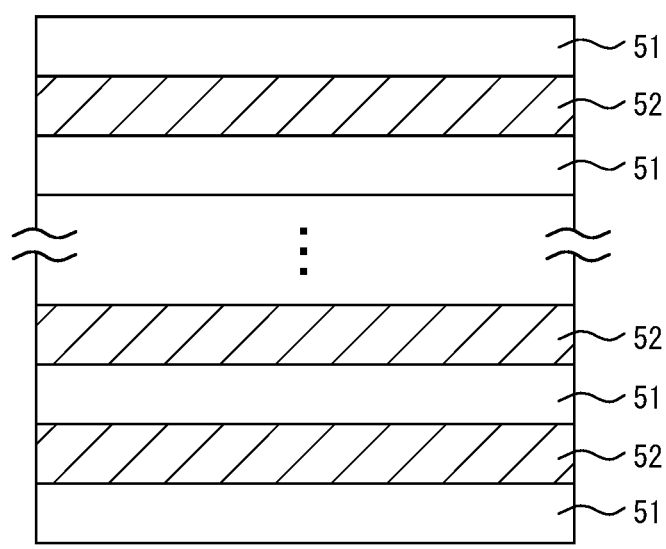
FIG. 1 is a schematic cross-sectional view illustrating one form of a light-emitting layer in a semiconductor light-emitting element according to the present disclosure.

The following describes various definitions in the present specification in advance of describing embodiments according to the present disclosure.

<III-V compound semiconductor layers>

Firstly, when referring simply to a "III-V compound semiconductor" in the present specification, the composition thereof is represented by a general formula: $(In_aGa_bAl_c)(P_xAs_ySb_z)$. The following relationships hold for the composition ratios of the various elements.

For the group III elements, $c=1-a-b$, $0 \le a \le 1$, $0 \le b \le 1$, and $0 \le c \le 1$.

For the group V elements, $z=1-x-y$, $0 \le x \le 1$, $0 \le y \le 1$, and $0 \le z \le 1$.

As described further below, a III-V compound semiconductor layer in a light-emitting layer contains three or more types of elements that are composed of one type or two or more types of group III elements selected from the group consisting of Al, Ga, and In and one type or two or more types of group V elements selected from the group consisting of As, Sb, and P. It is more preferable that four or more types of elements are used because combinations that enable a ratio of a lattice constant difference with a growth substrate that is 1% or less are limited when only three types of elements are used. In the preceding general formula, one ratio or two or more ratios among the composition ratios a, b, and c and one ratio or two or more ratios among the composition ratios x, y, and z are more than 0, and three or more ratios, in total, among these composition ratios are more than 0.

Composition Wavelength and Lattice Constant Based on Composition

In calculation of composition wavelengths and lattice constants based on compositions in the present specification, values described in the literature (Haruo Nagai, et al., "Photonics Series 6: III-V Semiconductor Mixed Crystals", First Edition, Corona Publishing, Oct. 25, 1988) were used (values of non-linear factors for ternary mixed crystals from Table 2.1, lattice constants for binary crystals from Table 2.2, elastic stiffness constants for binary crystals from Table 2.3, band gaps for binary crystals from Table 2.7, etc.). Although the following description refers mainly to an InGaAsP system, calculations can also be made based on literature values in the aforementioned literature in a case in which Al and/or Sb is included. Hereinafter, a case in which two from a, b, and c and two from x, y, and z are included from among the composition ratios a, b, c, x, y, and z is referred to as a quasi-quaternary mixed crystal, and a case in which three from a, b, and c and one from x, y, and z (or one from a, b, and c and three from x, y, and z) are included is referred to as a quasi-ternary mixed crystal.

The "composition wavelength" of a III-V compound semiconductor layer referred to in the present specification is a wavelength $\lambda$ that is calculated by the following equation <1> from the energy band gap Eg, which is based on the composition of the III-V compound semiconductor layer.

$$E_g = 1239.8/\lambda \qquad <1>$$

In a case in which each composition ratio (solid phase ratio) is known, the energy band gaps E of four ternary mixed crystals that are the basis of the quasi-quaternary mixed crystal are determined using non-linear factors for the ternary mixed crystals. Using an InGaAsP system (i.e., a general formula: $(In_aGa_b)(P_xAs_y)$) as an example for illustrative purposes, energy band gaps E that take into account non-linear factors are calculated for the ternary mixed crystals (Ga,In)P, (Ga,In)As, Ga(P,As), and In(P,As). This calculation is performed using literature values of 1.35 for InP, 2.74 for GaP, 0.36 for InAs, and 1.42 for GaAs as the respective band gaps E0 [eV] of these binary systems, and using literature values of 0.7 for (Ga,In)P, 0.51 for (Ga,In)As, 0.3 for Ga(P,As), and 0.23 for In(P,As) as the values of non-linear factors (bowing parameters $E_0$ [eV]). For example, the energy band gap $E_{abx}$ of $In_aGa_bP$ is calculated as follows.

$$E_{abx} = 1.35 \times a + 2.74 \times b - 0.7 \times a \times b$$

Calculations are made in the same manner for the other ternary mixed crystals.

Once the energy band gaps of the four ternary mixed crystals have been calculated, a physical property value $Eg_{abxy}$ of the quasi-quaternary mixed crystal $(In_aGa_b)(P_xAs_y)$ (band gap of the quasi-quaternary mixed crystal) can be determined based on Vegard's law through the following equation <2> using physical property values $E_{ab}x$, $E_{aby}$, $E_{axy}$, and $E_{bxy}$ for the four ternary mixed crystals (energy band gaps taking into account non-linear factors that have been determined as described above).

$$Eg_{abxy} = \frac{\{a \times b \times (x \times E_{abx} + y \times E_{aby}) + x \times y \times (a \times E_{axy} + b \times E_{bxy})\}}{(a \times b + x \times y)} \quad \langle 2 \rangle$$

Since the physical property values of the four ternary mixed crystals take into account non-linear factors in the preceding equation <2>, the calculated physical property value for the quasi-quaternary mixed crystal also inevitably takes into account a non-linear factor.

Next, calculation of lattice constants of mixed crystals in the present specification is described. Although there are two types of lattice constants in a vertical direction (growth direction) and a horizontal direction (in-plane direction) relative to the plane of a substrate, a value for the vertical direction is used in the present specification. First, a simple lattice constant for the mixed crystal is calculated in accordance with Vegard's law. Using an InGaAsP system (i.e., a general formula: $(In_aGa_b)(P_xAs_y)$) as an example for illustrative purposes, a physical property constant $A_{abxy}$ (lattice constant according to Vegard's law) is calculated from the following equation <3> based on physical property constants $B_{ax}$, $B_{bx}$, $B_{ay}$, and $B_{by}$ (literature value lattice constants shown below in Table 1) for the four binary mixed crystals that are the basis for the quasi-quaternary mixed crystal in a case in which each composition ratio (solid phase ratio) is known.

$$S_{abxy} = a \times x \times B_{ax} + b \times x \times B_{bx} + a \times y \times B_{ay} + b \times y \times B_{by} \quad \langle 3 \rangle$$

TABLE 1

| | Lattice constant [nm] | $C_{11}$ | $C_{12}$ |
|---|---|---|---|
| InP | 0.58688 | 10.22 | 5.76 |
| GaP | 0.54512 | 14.12 | 6.253 |
| InAs | 0.60584 | 8.329 | 4.526 |
| GaAs | 0.56533 | 11.88 | 5.38 |

Next, with regards to the elastic constants C11 and C12, elastic constants $C11_{abxy}$ and $C12_{abxy}$ for $(In_aGa_b)(P_xAs_y)$ are also calculated in the same way as in equation <3>.

When the lattice constant of a growth substrate is taken to be as, a (vertical direction) lattice constant $a_{abxy}$ that takes into account lattice deformation can be determined using the following equation <4> by taking into account lattice deformation based on the elastic properties of the semiconductor crystal.

$$a_{abxy} = A_{abxy} - 2 \times (a_s - A_{abxy}) \times C12_{abxy} / C11_{abxy} \quad \langle 4 \rangle$$

Since InP is used as a growth substrate in a present embodiment, the lattice constant of InP may be used as the lattice constant as of the growth substrate.

In the case of a quasi-ternary mixed crystal, when a general formula: $(In_aGa_bAl_c)(As)$ is taken as an example, the band gap $Eg_{abcy}$ and the lattice constant $A_{abcy}$ according to Vegard's law can be calculated from the following equations <5> and <6>.

$$Eg_{abcy} = \frac{\{a \times b \times E_{aby} + b \times c \times E_{bcy} + c \times a \times E_{acy}\}}{(a \times b + b \times c + c \times a)} \quad \langle 5 \rangle$$

$$A_{abcy} = a \times B_{ay} b \times B_{by} + c \times B_{cy} \quad \langle 6 \rangle$$

Note that in a case in which the III-V compound semiconductor is a ternary, pentanary, or hexanary III-V compound semiconductor, the composition wavelength and the lattice constant can be determined by modifying the equations according to the same reasoning as described above. Moreover, in the case of a binary III-V compound semiconductor, values described in the aforementioned literature can be used.

<p-, n-, i-Types and Dopant Concentrations>

In the present specification, a layer that functions electrically as a p-type is referred to as a p-type layer and a layer that functions electrically as an n-type is referred to as an n-type layer. On the other hand, a layer to which a specific impurity such as Si, Zn, S, Sn, or Mg is not intentionally added and that does not function electrically as a p-type or an n-type is referred to as an "i-type" or as "undoped". A III-V compound semiconductor layer that is undoped may contain impurities that are unavoidably mixed in during a production process. Specifically, when a layer has a low dopant concentration (for example, less than $7.6 \times 10^{15}$ atoms/cm$^3$), the layer is treated as "undoped" in the present specification. Values for the impurity concentrations of Si, Zn, S, Sn, Mg, and the like are taken to be values according to SIMS analysis. Likewise, values for impurity concentrations ("dopant concentrations") of n-type dopants (for example, Si, S, Te, Sn, Ge, O, etc.) in active layers are also taken to be values according to SIMS analysis. Also note that values for dopant concentrations are taken to be the values for dopant concentrations at the thickness direction centers of active layers because the values for dopant concentrations change significantly in proximity to the boundaries of semiconductor layers.

Film Thicknesses and Compositions of Layers

The overall thickness of formed layers can be measured using a spectroscopic film thickness measurement instrument. Moreover, the thickness of each layer can be calculated from cross-section observation of a grown layer through a spectroscopic film thickness measurement instrument and a transmission electron microscope. Moreover, the thickness can be measured using TEM-EDS in a case in which layers have small thicknesses of the order of several nanometers like that of a superlattice structure, and the composition ratios (solid phase ratios) of layers of a light-emitting layer are taken to be values obtained through SIMS analysis after exposure of the light-emitting layer in the present specification. Note that in a case in which a given layer has a slanted surface in a cross-sectional view of each layer, the maximum height from a flat surface of a layer directly below the given layer is taken to be the thickness of the given layer.

The following provides a detailed, illustrative description of embodiments of the present disclosure with reference to the drawings. Note that constituent elements that are the same are, as a rule, allotted the same reference numbers, and repeated description thereof is omitted. Also note that in the drawings, ratios of the height and width of a substrate and each layer are illustrated in a manner that is exaggerated relative to the actual ratios thereof in order to facilitate description.

Semiconductor Light-Emitting Element

The following refers to FIG. 1, which illustrates one aspect of the present disclosure. A semiconductor light-emitting element according to the present disclosure includes a light-emitting layer 50 having a layered structure in which a first III-V compound semiconductor layer 51 and a second III-V compound semiconductor layer 52 having different composition ratios are stacked repeatedly. Hereinafter, the first III-V compound semiconductor layer 51 and the second III-V compound semiconductor layer 52 are also referred to simply as a first layer 51 and a second layer 52, respectively. In the semiconductor light-emitting element according to the present disclosure, group III element in the first layer 51 and the second layer 52 is one type or two or more types selected from the group consisting of Al, Ga, and In, and group V element in the first layer 51 and the second layer 52 is one type or two or more types selected from the group consisting of As, Sb, and P.

Hereinafter, the composition of a III-V compound semiconductor of the first layer 51 is denoted as $(In_{a1}Ga_{b1}Al_{c1})(P_{x1}As_{y1}Sb_{z1})$, where $c_1=1-a_1-b_1$, $z_1=1-x_1-y_1$, $0 \le a_1 \le 1$, $0 \le b_1 \le 1$, $0 \le c_1 \le 1$, $0 \le x_1 \le 1$, $0 \le y_1 \le 1$, and $0 \le z_1 \le 1$. Likewise, the composition of a III-V compound semiconductor of the second layer 52 is denoted as $(In_{a2}Ga_{b2}Al_{c2})(P_{x2}As_{y2}Sb_{z2})$, where $c_2=1-a_2-b_2$, $z_2=1-x_2-y_2$, $0 \le a_2 \le 1$, $0 \le b_2 \le 1$, $0\, c_2 \le 1$, $0 \le x_2 \le 1$, $0 \le y_2 \le 1$, and $0 \le z_2 \le 1$. The first layer 51 and the second layer 52 according to the present disclosure each contain three or more types of elements, in total, that are one type or two or more types from the group III elements and one type or two or more types from the group V elements.

Moreover, in the present disclosure, a composition wavelength difference between a composition wavelength of the first layer 51 and a composition wavelength of the second layer 52 is 50 nm or less, and a ratio of a lattice constant difference between a lattice constant of the first layer 51 and a lattice constant of the second layer 52 is not less than 0.05% and not more than 0.60%. Note that the composition wavelength difference and the lattice constant difference are each a value in terms of an absolute value. Also note that the ratio of the lattice constant difference is defined as a value obtained by dividing an absolute value of the lattice constant difference between the first layer 51 and the second layer 52 by an average value of the lattice constants of the first layer 51 and the second layer 52. In a case in which a subsequently described third layer 53 is included, the ratio of the lattice constant difference is calculated for each set of adjacent layers as a value obtained by dividing an absolute value of a lattice constant difference between the first layer 51 and the third layer 53 by an average value of the lattice constants of the first layer 51 and the third layer 53 and as a value obtained by dividing an absolute value of a lattice constant difference between the third layer 53 and the second layer 52 by an average value of the lattice constants of the third layer 53 and the second layer 52, and each of these values is not less than 0.05% and not more than 0.60%. The inventors have experimentally confirmed that when the composition wavelength difference and lattice constant difference based on the composition ratios of the first layer 51 and the second layer 52 satisfy the relationships set forth above, light emission output of a semiconductor light-emitting element can be significantly increased compared to that conventionally achieved.

Although it is not clear why the light emission output of a semiconductor light-emitting element is increased through the composition wavelength difference and the lattice constant difference satisfying the conditions set forth above, and the present disclosure is not restricted by theory, the inventors think that the disclosed effect is obtained for the following reason. When the composition wavelength difference is 50 nm or less, there is only a barrier that holes can easily pass over at the junction temperature during passing of current (during light emission), and the band structure during passing of current (during light emission) is similar to a double heterostructure without a composition wavelength difference. Moreover, when the composition wavelength difference is 30 nm or less (more preferably 25 nm or less), there is only a low barrier that can easily be passed over even through the thermal energy at room temperature during non-passing of current, and thus the band structure becomes even closer to a double heterostructure without a composition wavelength difference such that it is almost the same as a double heterostructure. Light emission output is thought to increase due to the barrier height being reduced through the band structure becoming closer to a double heterostructure, and due to an electron confinement effect similar to a quantum well structure being obtained through valence band splitting due to strain caused by the lattice constant difference.

In order to more reliably obtain the disclosed effect, the ratio of the lattice constant difference between the first layer 51 and the second layer 52 is preferably 0.05% or more, and more preferably 0.3% or more, and, in particular, the difference between the composition wavelengths of the first layer 51 and the second layer 52 may be 20 nm or less, may be 1 nm or less, or the composition wavelengths may be the same (i.e., the composition wavelength difference may be 0 nm).

Moreover, it is more preferable that the group III element is the two types Ga and In and that the group V element is two or more types selected from the group consisting of As, Sb, and P. Furthermore, an InGaAsP quaternary compound semiconductor (hereinafter, also referred to as an InGaAsP semiconductor) is even more preferable. When the III-V compound semiconductor materials of the first layer 51 and the second layer 52 are each an InGaAsP quaternary compound semiconductor, the disclosed effect can reliably be obtained. In this case, the composition ratio $c_1$ of Al and the composition ratio $z_1$ of Sb in the first layer 51 are both 0, and the composition formula is $(In_{a1}Ga_{b1})(P_{x1}As_{y1})$, where $b_1=1-a_1$, $y_3=1-x_1$, $0 \le a_1 \le 1$, $0 \le b_1 \le 1$, $0 \le x_1 \le 1$, and $0 \le y_1 \le 1$. Moreover, the composition ratio $c_2$ of Al and the composition ratio $z_2$ of Sb in the second layer 52 are both 0, and the composition formula is $(In_{a2}Ga_{b2})(P_{x2}As_{y2})$, where $b_2=1-a_2$, $y_2=1-x_2$, $0 \le a_2 \le 1$, $0 \le b_2 \le 1$, $0\, x_2 \le 1$, and $0 \le y_2 \le 1$.

Figure 2:
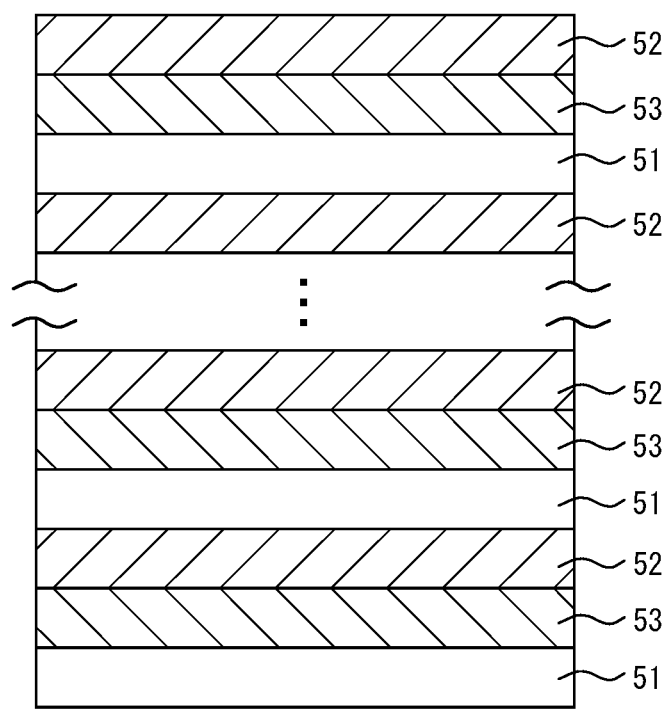
FIG. 2 is a schematic cross-sectional view illustrating another form of a light-emitting layer in a semiconductor light-emitting element according to the present disclosure.

The layered structure of the light-emitting layer 50 in the semiconductor light-emitting element according to the present disclosure may be composed of just the first layer 51 and the second layer 52, or may include a further III-V compound semiconductor layer. For example, as illustrated in FIG. 2, which illustrates another aspect of the present disclosure, the layered structure of the light-emitting layer 50 may further include a third III-V compound semiconductor layer 53 (hereinafter, referred to simply as a third layer 53) between the first layer 51 and the second layer 52. The following describes a preferred form of the third layer 53.

In the same manner as for the first layer 51 and the second layer 52, the composition of a III-V compound semiconductor of the third layer 53 is denoted as $(In_{a3}Ga_{b3}Al_{c3})$ $(P_{x3}As_{y3}Sb_{z3})$, where $c_3=1-a_3-b_3$, $z_3=1-x_3-y_3$, $0 \le a_3 \le 1$, $0 \le b_3 \le 1$, $0 \le c_3 \le 1$, $0 \le x_3 \le 1$, $0 \le y_3 \le 1$, and $0 \le z_3 \le 1$. In a case in which the light-emitting layer 50 includes the third layer 53, the third layer 53 preferably contains three of more types of elements that are selected as one type or two or more types from the previously described group III elements and one type or two or more types from the previously described group V elements in the same way as the first layer 51 and the second layer 52. Moreover, in this case, it is preferable that the composition wavelength differences between a first layer 51 and a third layer 53 that are adjacent, a third layer 53 and a second layer 52 that are adjacent, and a second layer 52 and a first layer 51 that are adjacent are each 50 nm or less, and that the ratios of lattice constant differences for these adjacent layers are each not less than 0.05% and not more than 0.60%. Furthermore, in a case in which the third layer 53 is included, the III-V compound semiconductor material of the third layer 53 preferably has Ga and In as group III elements and two or more types selected from the group consisting of As, Sb, and P as group V elements, and is more preferably an InGaAsP quaternary compound semiconductor (hereinafter, referred to as an InGaAsP semiconductor) from a viewpoint of more reliably obtaining the disclosed effect. In this case, the composition ratio $c_3$ of Al and the composition ratio $z_3$ of Sb in the third layer 53 are both 0.

Film Thickness

Although no limitations are placed on the film thickness of the overall light-emitting layer 50, the film thickness thereof can be 1 μm to 8 μm, for example. Moreover, although no limitations are placed on the film thickness of each layer among the first layer 51, the second layer 52, and the third layer 53 in the layered structure of the light-emitting layer 50, the film thickness thereof can be approximately 1 nm to 15 nm, for example. The film thicknesses of these layers may be the same or different. Moreover, the film thicknesses of first layers 51 in the layered structure may each be the same or different. The same applies to the film thicknesses of second layers 52 and the film thicknesses of third layers 53. However, a case in which the film thicknesses of first layers 51 are the same and the film thicknesses of second layers 52 are the same (and film thicknesses of third layers are the same in a case in which third layers 53 are included), and in which the light-emitting layer 50 has a superlattice structure is one preferred form in the present disclosure.

Number of Stacked Groups

The following refers to FIG. 1. Although no limitations are placed on the number of groups of both a first layer 51 and a second layer 52, the number of groups can be 3 groups to 50 groups, for example. One extremity of the layered structure can be a first layer 51 and the other extremity of the layered structure can be a second layer 52. In this case, the number of groups of a first layer 51 and a second layer 52 is denoted as n groups (n is a natural number).

Moreover, one extremity of the layered structure may be a first layer 51, a repeated structure of a second layer 52 and a first layer 51 may then be provided, and the other extremity of the layered structure may be a first layer 51. Alternatively, both extremities may conversely be a second layer 52. In this case, the number of groups of a first layer 51 and a second layer 52 is denoted as n (n is a natural number), and the number of groups can be said to be n.5 groups. In FIG. 1, both extremities of the layered structure are illustrated as being a first layer 51.

Figure 3:
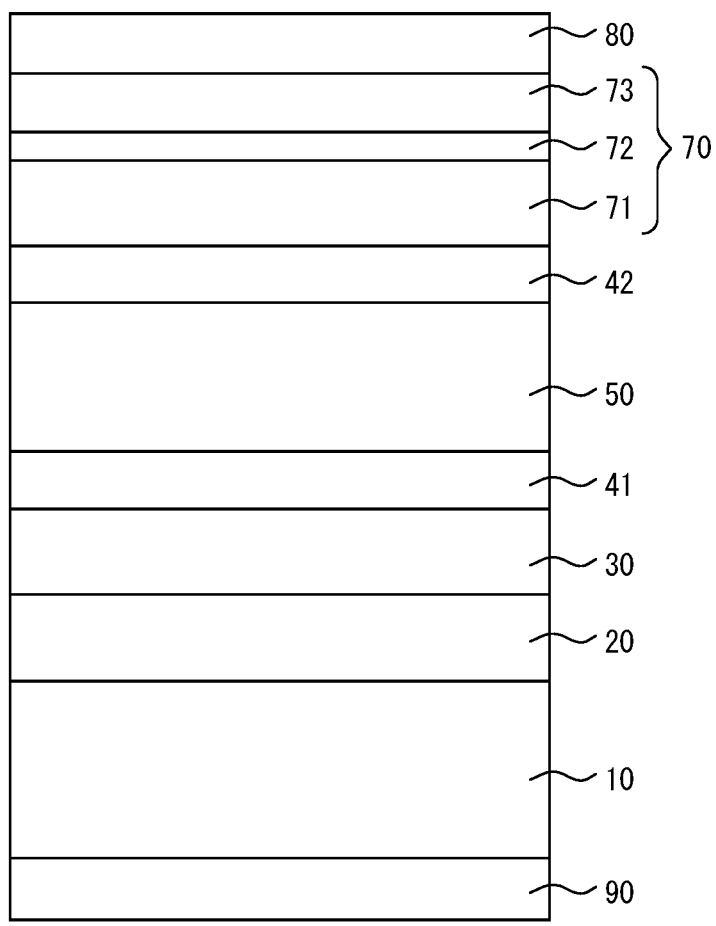
FIG. 3 is a schematic cross-sectional view illustrating a semiconductor light-emitting element according to one embodiment of the present disclosure.

Also note that no limitations are placed on the number of groups in a case in which the layered structure includes third layers 53 as illustrated in FIG. 3, and the number of groups may be 3 groups to 50 groups in the same way as in the form described with reference to FIG. 1. Although FIG. 2 illustrates a case in which the number of stacked groups is n groups, limitation to this form is not essential.

Composition Ratios

So long as the conditions relating to the composition wavelength difference and the lattice constant difference are satisfied, no limitations are placed on the composition ratios a, b, c, x, y, and z of the III-V compound semiconductor of each layer among the first layer 51, the second layer 52, and the third layer 53. However, the ranges from which these composition ratios are selected are preferably set such that each ratio of a lattice constant difference between a growth substrate and the light-emitting layer (first layer and second layer) is 1% or less in order to inhibit deterioration of crystallinity of the light-emitting layer. In other words, it is preferable that a value obtained by dividing an absolute value of the lattice constant difference between the growth substrate and the first layer by an average value for the growth substrate and the first layer and a value obtained by dividing an absolute value of the lattice constant difference between the growth substrate and the second layer by an average value for the growth substrate and the second layer are each 1% or less. For example, when an InP substrate is used as a growth substrate in a case in which the central emission wavelength is 1,000 nm to 1,900 nm, the composition ratio a of In can be set as 0.0 to 1.0, the composition ratio b of Ga can be set as 0.0 to 1.0, the composition ratio c of Al can be set as 0.0 to 0.35, the composition ratio x of P can be set as 0.0 to 0.95, the composition ratio y of As can be set as 0.15 to 1.0, and the composition ratio z of Sb can be set as 0.0 to 0.7 in each layer. The composition ratios may be set from within these ranges as appropriate such that the conditions relating to the composition wavelength difference and the ratio of the lattice constant difference are satisfied. The central emission wavelength mentioned above is merely one example. For example, the central emission wavelength can be set within a range of not less than 1,000 nm and not more than 2,200 nm in the case of an InGaAsP quaternary compound semiconductor (hereinafter, referred to as an InGaAsP semiconductor), and can set as infrared of an even longer wavelength (11 μm or less) in a case in which Sb is included.

Dopant

Although no limitations are placed on a dopant in each layer of the light-emitting layer 50, it is preferable that the first layer 51, the second layer 52, and the third layer 53 are each an i-type in order to reliably obtain the disclosed effect. However, each of the layers may be doped with an n-type or p-type dopant.

The following describes specific forms that the presently disclosed semiconductor light-emitting element can further include, but is not intended to limit the specific configuration of the presently disclosed semiconductor light-emitting element. A semiconductor light-emitting element 100 according to one embodiment of the present disclosure is described with reference to FIG. 3.

The semiconductor light-emitting element 100 according to one embodiment of the present disclosure includes at least a light-emitting layer 50 including the layered structure set forth above, and preferably has a desired configuration from a supporting substrate 10, an intervening layer 20, a first conductivity type III-V compound semiconductor layer 30, a first spacer layer 41, a light-emitting layer 50, a second spacer layer 42, and a second conductivity type III-V compound semiconductor layer 70, in this order. Moreover, the semiconductor light-emitting element 100 can further include a second electrode 80 on the second conductivity type III-V compound semiconductor layer 70 and a first electrode 90 at a rear surface of the supporting substrate 10. Note that when the first conductivity type is an n-type, the second conductivity type is a p-type. Conversely, when the first conductivity type is a p-type, the second conductivity type is an n-type. The following describes a form for a case in which the first conductivity type is an n-type and the second conductivity type is a p-type. In order to facilitate description, the first conductivity type III-V compound semiconductor layer 30 is denoted as an n-type semiconductor layer 30 and the second conductivity type III-V compound semiconductor layer 70 is denoted as a p-type semiconductor layer 70 in the following description, and the present embodiment is described in accordance with this specific example. As a result of the light-emitting layer 50 being sandwiched between the n-type semiconductor layer 30 and the p-type semiconductor layer 70, a structure like a double heterostructure can be set, and passing of current to the light-emitting layer 50 causes light emission through combination of electrons and holes in the light-emitting layer 50.

Growth Substrate

A growth substrate may be selected as appropriate from compound semiconductor substrates such as an InP substrate, an InAs substrate, a GaAs substrate, a GaSb substrate, and an InSb substrate in accordance with the composition of the light-emitting layer 50. It is preferable that the conductivity type of each substrate is set to correspond to the conductivity type of a semiconductor layer on the growth substrate. Examples of compound semiconductor substrates that can be adopted in the present embodiment include an n-type InP substrate and an n-type GaAs substrate.

Supporting Substrate

The supporting substrate 10 can be a growth substrate used to grow the light-emitting layer 50 on the supporting substrate 10. In a case in which a subsequently described bonding method is adopted, various types of substrates other than a growth substrate may be used as the supporting substrate 10.

Intervening Layer

An intervening layer 20 may be provided on the supporting substrate 10. The intervening layer 20 can be a III-V compound semiconductor layer. The intervening layer 20 can be used as an initial growth layer for epitaxial growth of a semiconductor layer on a supporting substrate 10 that serves as a growth substrate. Moreover, the intervening layer 20 can be used as a buffer layer for buffering lattice strain between a supporting substrate 10 that serves as a growth substrate and the n-type semiconductor layer 30, for example. Furthermore, the intervening layer 20 can also be used as an etching stop layer by performing lattice matching of the growth substrate and the intervening layer 20 while altering the semiconductor composition. For example, in a case in which the supporting substrate is an n-type InP substrate, the intervening layer 20 is preferably an n-type InGaAs layer. In this case, the composition ratio of In among the group III elements is preferably 0.3 to 0.7, and more preferably 0.5 to 0.6 in order to perform lattice matching of the intervening layer 20 with the InP growth substrate. Moreover, AlInAs, AlInGaAs, or InGaAsP may be adopted so long as composition ratios are set such that the lattice constant is close to that of the InP substrate to the same degree as InGaAs described above. The intervening layer 20 may be a single layer or may be a composite layer (for example, a superlattice layer) with another layer.

n-Type Semiconductor Layer

An n-type semiconductor layer 30 can be provided on the supporting substrate 10 and, as necessary, the intervening layer 20, and this n-type semiconductor layer 30 can be used as an n-type cladding layer. The composition of a III-V compound semiconductor of the n-type semiconductor layer 30 can be set as appropriate in accordance with the composition of a III-V compound semiconductor of the light-emitting layer 50. For example, an n-type InP layer can be used in a case in which the light-emitting layer 50 is formed of an InGaAsP semiconductor. The n-type semiconductor layer 30 may have a single layer structure or may be a composite layer including a plurality of stacked layers. The thickness of the n-type cladding layer can, for example, be 1 μm to 5 μm.

Spacer Layers

It is preferable that a first spacer layer 41 and a second spacer layer 42 are provided between the n-type semiconductor layer 30 and the light-emitting layer 50 and between the p-type semiconductor layer 70 and the light-emitting layer 50. The first spacer layer 41 can be an undoped or n-type III-V compound semiconductor layer, with the use of an i-type InP spacer layer, for example, being preferable. On the other hand, the second spacer layer 42 at the p-side is preferably an undoped III-V compound semiconductor layer. For example, an i-type InP spacer layer can be used. By providing an undoped spacer layer 42, it is possible to prevent unnecessary dopant diffusion between the light-emitting layer 50 and a p-type layer. The thicknesses of the spacers layers 41 and 42 are not limited and may, for example, be 5 nm to 500 nm.

p-Type Semiconductor Layer

A p-type semiconductor layer 70 can be provided on the light-emitting layer 50 and, as necessary, the second spacer layer 42. The p-type semiconductor layer 70 can include a p-type cladding layer 71 and a p-type contact layer 73 in order from the side where the light-emitting layer 50 is located. An intermediate layer 72 is preferably provided between the p-type cladding layer 71 and the p-type contact layer 73. The inclusion of the intermediate layer 72 makes it possible to ease lattice mismatch of the p-type cladding layer 71 and the p-type contact layer 73. The composition of a III-V compound semiconductor of the p-type semiconductor layer 70 can be set as appropriate in accordance with the composition of a III-V compound semiconductor of the light-emitting layer 50. For example, the p-type cladding layer may be p-type InP, the intermediate layer may be p-type InGaAsP, and the p-type contact layer 73 may be p-type InGaAs that does not contain P in a case in which the light-emitting layer 50 is formed of an InGaAsP semiconductor. Although no specific limitations are placed on the film thickness of each layer in the p-type semiconductor layer 70, the film thickness of the p-type cladding layer 71 can be 1 µm to 5 µm, for example, the film thickness of the intermediate layer 72 can be 50 nm to 200 nm, for example, and the film thickness of the p-type contact layer 73 can be 50 nm to 200 nm, for example.

Electrodes

A second electrode 80 and a first electrode 90 can be provided on the p-type semiconductor layer 70 and at a rear surface of the supporting substrate 10, respectively. A metal material used to form each of the electrodes can be a typically used material, examples of which include metals such as Ti, Pt, and Au, and also metals (Sn, etc.) that form a eutectic alloy with gold. Moreover, the electrode pattern of each of the electrodes can be any pattern without any limitations.

Although the preceding description describes an embodiment in which a compound semiconductor substrate is used as a growth substrate and in which this growth substrate is used as the supporting substrate 10, the present disclosure is not limited thereto. After each semiconductor layer has been formed on a growth substrate, a bonding method may be adopted to remove the growth substrate while affixing a semiconductor substrate such as a Si substrate, a metal substrate such as Mo, W, or Kovar, any of various types of submount substrate in which AlN, etc., is used, or the like, and this substrate may be used as the supporting substrate of the presently disclosed semiconductor light-emitting element (hereinafter, this method is referred to as a "bonding method"; refer to JP 2018-006495 A).

In a case in which a bonding method is adopted, the semiconductor light-emitting element 100 can include a layer other than the electrodes that is not a III-V compound semiconductor. For example, in a case in which a bonding method is adopted, an intervening layer 20 formed of a metal material can be formed on a supporting substrate 10 formed of a Si substrate, and a p-type semiconductor layer 70, a light-emitting layer 50, and an n-type semiconductor layer 30 are formed in order thereon. Note that the intervening layer 20 can be used as a metal reflective layer on the supporting substrate 10. Moreover, besides the III-V compound semiconductor layers, a dielectric layer including ohmic electrode sections can be provided in the semiconductor light-emitting element 100 as necessary. The dielectric material may be $SiO_2$, SiN, ITO, or the like.

As previously mentioned, although a case in which the first conductivity type semiconductor layer is an n-type and the second conductivity type semiconductor layer is a p-type is described as an example in the preceding embodiment, it should be understood that the n-type/p-type of the conductivity types of the layers in the preceding embodiment can of course be reversed.

Production Method of Semiconductor Light-Emitting Element

A production method of the previously described semiconductor light-emitting element according to the present disclosure includes at least a first step of forming a first layer 51, a second step of forming a second layer 52, and a light-emitting layer formation step of repeatedly performing the first step and the second step to form a light-emitting layer 50. A third step of forming a third layer 53 may also be included. In this case, the first step of forming the first layer 51, the third step of forming the third layer 53, and the second step of forming the second layer 52 can be performed repeatedly in the light-emitting layer formation step.

Steps of forming the various layers of the semiconductor light-emitting element 100 described with reference to FIG. 3 may also be included as necessary. Since III-V compound semiconductor materials that can be used as the first layer 51 and the second layer 52, conditions for the composition wavelength difference and lattice constant difference thereof, film thicknesses, the number of stacked groups, and so forth are as previously described, repeated description thereof is omitted.

Each III-V compound semiconductor layer can be formed by a commonly known thin film growth method such as metal organic chemical vapor deposition (MOCVD), molecular beam epitaxy (MBE), or sputtering. In the case of an InGaAsP semiconductor, trimethylindium (TMIn) as an In source, trimethylgallium (TMGa) as a Ga source, arsine ($AsH_3$) as an As source, and phosphine ($PH_3$) as a P source, for example, can be used in a specific mixing ratio, and these source gases can be used to perform vapor phase growth while also using a carrier gas to thereby enable epitaxial growth of an InGaAsP semiconductor layer of desired thickness in accordance with the growth time. Moreover, trimethylaluminum (TMA) or the like may be used as an Al source in a case in which Al is used as a group III element, and TMSb (trimethylantimony) or the like may be used as an Sb source in a case in which Sb is used as a group V element. Furthermore, in a case in which p-type or n-type doping of a semiconductor layer is performed, a dopant source gas containing Si, Zn, or the like in constituent elements may also be used as desired.

Formation of metal layers such as the first electrode and the second electrode can be performed by commonly known techniques such as sputtering, electron beam evaporation, and resistance heating, for example. When a dielectric layer is to be formed in a case in which a bonding method is adopted, a commonly known film formation method such as plasma CVD or sputtering may be used, and formation of irregularities can be performed by a commonly known etching method as necessary.

In a case in which a bonding method (refer to JP 2018-006495 A mentioned above) is adopted, the semiconductor light-emitting element can be produced as described below, for example.

First, various III-V compound semiconductor layers including an etching stop layer, an n-type semiconductor layer 30, a light-emitting layer 50, a p-type cladding layer 71, an intermediate layer 72, and a p-type contact layer 73 are formed, in order, on a growth substrate. Next, p-type ohmic electrode sections dispersed in island shapes are formed on the p-type contact layer 73. Thereafter, a resist mask is formed at the p-type ohmic electrode sections and at the peripheries thereof, and the p-type contact layer 73 is removed by wet etching or the like at locations other than locations where the ohmic electrode sections have been formed to expose the intermediate layer 72. A dielectric layer is then formed on the intermediate layer 72. The dielectric layer of the p-type ohmic electrode sections and the peripheries thereof is removed by etching to expose the intermediate layer 72, and a metal reflective layer is formed on the intermediate layer 72.

On the other hand, a conductive Si substrate or the like is used as a supporting substrate, and a metal bonding layer is formed on the supporting substrate. The metal reflective layer and the metal bonding layer are arranged in opposition and are bonded through hot compression or the like. The growth substrate is then removed by etching while also etching the etching stop layer to expose the n-type semiconductor layer 30. By then forming an upper surface electrode on the n-type semiconductor layer 30, it is possible to obtain bonding-type semiconductor light-emitting element. As previously described, the n-type/p-type of conductivity types of the layers may be reversed relative to the example described above.

The following provides a more detailed description of the present disclosure using examples. However, the present disclosure is not in any way limited by the following examples.

EXAMPLES

Experimental Example 1

Semiconductor light-emitting elements according to Example 1 and Comparative Examples 1 to 3, described below, were produced by a bonding method with 1,300 nm as a target central emission wavelength.

Example 1

Configurations of III-V compound semiconductor layers of a semiconductor light-emitting element 100 according to Example 1 are described with reference to the reference signs in FIG. 3. A S-doped n-type InP substrate was used as a growth substrate. On a (100) face of the n-type InP substrate (S-doped; dopant concentration: $2 \times 10^{18}$ atoms/cm$^3$), an n-type InP layer of 100 nm in thickness and an n-type $In_{0.57}Ga_{0.43}As$ layer of 20 nm in thickness (respectively an initial growth layer and an etching stop layer), an n-type InP layer of 2,000 nm in thickness (n-type semiconductor layer 30 serving as an n-type cladding layer), an i-type InP layer of 100 nm in thickness (first spacer layer 41), a light-emitting layer 50 described in detail further below, an i-type InP layer of 320 nm in thickness (second spacer layer 42), a p-type InP layer of 4,800 nm in thickness (p-type cladding layer 71), a p-type $In_{0.8}Ga_{0.2}As_{0.5}P_{0.5}$ layer of 50 nm in thickness (intermediate layer 72), and a p-type $In_{0.57}Ga_{0.43}As$ layer of 100 nm in thickness (p-type contact layer 73) were formed, in order, by MOCVD. The n-type InP layer and n-type InGaAs layer (respectively an initial growth layer and an etching stop layer) and the n-type InP layer (n-type semiconductor layer 30 serving as an n-type cladding layer) were subjected to Si doping such as to have a dopant concentration of $7 \times 10^{17}$ atoms/cm$^3$. The p-type InP layer (p-type cladding layer 71) was subjected to Zn doping such as to have a dopant concentration of $1 \times 10^{18}$ atoms/cm$^3$. The p-type InGaAsP layer (intermediate layer 72) and the p-type InGaAs layer (p-type contact layer 73) were subjected to Zn doping such as to have a dopant concentration of $1 \times 10^{19}$ atoms/cm$^3$.

In formation of the light-emitting layer 50, an i-type $In_{a1}Ga_{b1}As_{x1}P_{y1}$ layer (first layer 51) was first formed, and then ten i-type $In_{a2}Ga_{b2}As_{x2}P_{y2}$ layers (second layers 52) and ten i-type $In_{a1}Ga_{b1}As_{x1}P_{y1}$ layers (first layers 51) were stacked alternately so as to obtain a 10.5 group layered structure. In other words, both extremities of the light-emitting layer 50 were i-type $In_{a1}Ga_{b1}As_{x1}P_{y1}$ layers (first layers 51). The i-type $In_{a1}Ga_{b1}As_{x1}P_{y1}$ layers (first layers 51) were each $In_{0.675}Ga_{0.325}As_{0.689}P_{0.311}$ of 8 nm in thickness. In other words, the In composition ratio (a1) was 0.675, the Ga composition ratio (b1) was 0.325, the As composition ratio (x1) was 0.689, and the P composition ratio (y1) was 0.311. Moreover, the i-type $In_{a2}Ga_{b2}As_{x2}P_{y2}$ layers (second layers 52) were each $In_{0.633}Ga_{0.367}As_{0.716}P_{0.284}$ of 5 nm in thickness. In other words, the In composition ratio (a2) was 0.633, the Ga composition ratio (b2) was 0.367, the As composition ratio (x2) was 0.716, and the P composition ratio (y2) was 0.284. The total film thickness of the light-emitting layer was 138 nm. Note that the compositions of the layers in Example 1 described above are values that were measured through SIMS analysis. Moreover, for each layer of the light-emitting layer, the light-emitting layer was exposed and then a solid phase ratio of each layer was confirmed by SIMS analysis.

p-Type ohmic electrode sections (Au/AuZn/Au; total thickness: 530 nm) were formed in dispersed island shapes on the p-type contact layer. Note that in island pattern formation, a resist pattern was formed, ohmic electrode was then vapor deposited, and lift-off of the resist pattern was performed to form the island pattern. The contact area ratio with the p-type contact layer was 4.5% and the chip size was 380 μm-square. Next, a resist mask was formed at the p-type ohmic electrode sections and the peripheries thereof, and the p-type contact layer was removed through tartaric acid-hydrogen peroxide wet etching at locations other than the locations where the ohmic electrode sections had been formed to expose the intermediate layer. Thereafter, a dielectric layer (thickness: 700 nm) formed of $SiO_2$ was formed over the entirety of the intermediate layer 72 by plasma CVD. A window pattern having a shape provided with a width of 3 μm in a width direction and a longitudinal direction in a region above each of the p-type ohmic electrode sections was formed by a resist, and the dielectric layer was removed by wet etching using BHF at the p-type ohmic electrode sections and the peripheries thereof to expose the intermediate layer 72.

Next, a metal reflective layer (Al/Au/Pt/Au) was formed over the entirety of the intermediate layer 72 by vapor deposition. The thicknesses of metal layers in the reflective metal layer were, in order, 10 nm, 650 nm, 100 nm, and 900 nm.

On the other hand, a metal bonding layer (Ti/Pt/Au) was formed on a conductive Si substrate (thickness: 300 μm) serving as a supporting substrate. The thicknesses of metal layers in the metal bonding layer were, in order, 650 nm, 10 nm, and 900 nm.

The metal reflective layer and the metal bonding layer were arranged in opposition and were hot compression bonded at 300° C. The n-type InP substrate was then removed by wet etching using dilute hydrochloric acid, and the etching stop layer was also removed by sulfuric acid-hydrogen peroxide wet etching to expose the n-type cladding layer.

An n-type electrode (Au (thickness: 10 nm)/Ge (thickness: 33 nm)/Au (thickness: 57 nm)/Ni (thickness: 34 nm)/Au (thickness: 800 nm)/Ti (thickness: 100 nm)/Au (thickness: 1,000 nm)) was then formed as a wiring section of an upper surface electrode on the n-type cladding layer through resist pattern formation, n-type electrode vapor deposition, and resist pattern lift-off. A pad section (Ti (thickness: 150 nm)/Pt (thickness: 100 nm)/Au (thickness: 2,500 nm)) was then formed on the n-type electrode to form an upper surface electrode pattern.

Finally, semiconductor layers were removed by mesa etching between elements (width: 60 μm) to form dicing lines. In addition, a rear surface electrode (Ti (thickness: 10 nm)/Pt (thickness: 50 nm)/Au (thickness: 200 nm)) was formed at a rear surface side of the Si substrate, and chip division was performed by dicing to thereby produce a semiconductor light-emitting element according to Example 1.

Comparative Examples 1 to 3

A semiconductor light-emitting element was formed by a bonding method in the same way as in Example 1 with the exception that the composition ratios of the first layers 51 and the second layers 52 in Example 1 were changed as indicated in Table 2. Table 2 shows the composition ratios of the first layers 51 and the second layers 52, and also composition wavelengths and lattice constants calculated therefrom, inclusive of those for Example 1. In Table 2, the composition wavelength difference and the ratio of the lattice constant difference are shown as absolute values. Note that the second layers 52 in Comparative Example 1 are i-type InP layers, and other constituent layers of a light-emitting layer are i-type InGaAsP layers.

Experimental Example 2

Semiconductor light-emitting elements according to Example 2 and Comparative Examples 4 to 8, described below, were produced by a bonding method with 1,460 nm as a target central emission wavelength.

Example 2 and Comparative Examples 4 to 8

Semiconductor light-emitting elements according to Example 2 and Comparative Examples 4 to 8 were formed by a bonding method in the same way as in Example 1 with the exception that the composition ratios of the first layers 51 and the second layers 52 in Example 1 were changed as indicated in Table 3. Note that the second layers 52 in Comparative Example 4 were i-type InP layers. Moreover, the composition wavelength difference and the ratio of the lattice constant difference for these examples are shown in Table 3 in the same way as in Table 2.

TABLE 2

| | First layer | | | | | | Second layer | | | | | | Com- position wave- length difference [nm] | Lattice constant difference [%] |
|---|---|---|---|---|---|---|---|---|---|---|---|---|---|---|
| | In com- position ratio $a_1$ | Ga com- position ratio $b_1$ | As com- position ratio $x_1$ | P com- position ratio $y_1$ | Com- position wave- length [nm] | Lattice constant [nm] | In com- position ratio $a_2$ | Ga com- position ratio $b_2$ | As com- position ratio $x_2$ | P com- position ratio $y_2$ | Com- position wave- length [nm] | Lattice constant [nm] | | |
| Example 1 | 0.6753 | 0.3250 | 0.6890 | 0.3111 | 1297.4 | 0.5865 | 0.6331 | 0.3670 | 0.7160 | 0.2836 | 1278.2 | 0.5841 | 19.2 | 0.41 |
| Comparative Example 1 | 0.7133 | 0.2867 | 0.7081 | 0.2919 | 1382.2 | 0.5904 | 1.0000 | 0.0000 | 0.0000 | 1.0000 | 918.5 | 0.5869 | 463.7 | 0.59 |
| Comparative Example 2 | 0.6900 | 0.3100 | 0.7474 | 0.2526 | 1410.8 | 0.5900 | 0.8094 | 0.1906 | 0.4240 | 0.5760 | 1132.2 | 0.5873 | 278.6 | 0.46 |
| Comparative Example 3 | 0.6900 | 0.3100 | 0.7474 | 0.2526 | 1410.8 | 0.5900 | 0.7268 | 0.2732 | 0.5899 | 0.4101 | 1231.4 | 0.5869 | 179.4 | 0.53 |

TABLE 3

| | First layer | | | | | | Second layer | | | | | | Com- position wave- length difference [nm] | Lattice constant difference [%] |
|---|---|---|---|---|---|---|---|---|---|---|---|---|---|---|
| | In com- position ratio $a_1$ | Ga com- position ratio $b_1$ | As com- position ratio $x_1$ | P com- position ratio $y_1$ | Com- position wave- length [nm] | Lattice constant [nm] | In com- position ratio $a_2$ | Ga com- position ratio $b_2$ | As com- position ratio $x_2$ | P com- position ratio $y_2$ | Com- position wave- length [nm] | Lattice constant [nm] | | |
| Example 2 | 0.6396 | 0.3604 | 0.8104 | 0.1896 | 1449.2 | 0.5885 | 0.5952 | 0.4048 | 0.8554 | 0.1446 | 1449.8 | 0.5864 | 0.6 | 0.36 |
| Comparative Example 4 | 0.6017 | 0.3983 | 0.8704 | 0.1296 | 1491.7 | 0.5875 | 1.0000 | 0.0000 | 0.0000 | 1.0000 | 918.5 | 0.5869 | 573.2 | 0.11 |
| Comparative Example 5 | 0.5451 | 0.4549 | 0.9272 | 0.0728 | 1513.2 | 0.5852 | 0.7302 | 0.2698 | 0.5725 | 0.4275 | 1213.7 | 0.5865 | 299.5 | 0.22 |
| Comparative Example 6 | 0.5589 | 0.4411 | 0.9222 | 0.0778 | 1527.9 | 0.5861 | 0.7156 | 0.2844 | 0.5851 | 0.4149 | 1211.4 | 0.5858 | 316.5 | 0.05 |

TABLE 3-continued

| | First layer | | | | | | Second layer | | | | | | Composition wavelength difference [nm] | Lattice constant difference [%] |
|---|---|---|---|---|---|---|---|---|---|---|---|---|---|---|
| | In composition ratio $a_1$ | Ga composition ratio $b_1$ | As composition ratio $x_1$ | P composition ratio $y_1$ | Composition wavelength [nm] | Lattice constant [nm] | In composition ratio $a_2$ | Ga composition ratio $b_2$ | As composition ratio $x_2$ | P composition ratio $y_2$ | Composition wavelength [nm] | Lattice constant [nm] | | |
| Comparative Example 7 | 0.5270 | 0.4730 | 0.9306 | 0.0694 | 1486.8 | 0.5838 | 0.7208 | 0.2792 | 0.5886 | 0.4114 | 1234.4 | 0.5862 | 252.4 | 0.41 |
| Comparative Example 8 | 0.5412 | 0.4588 | 0.9303 | 0.0697 | 1513.3 | 0.5850 | 0.7085 | 0.2915 | 0.6102 | 0.3898 | 1222.2 | 0.5863 | 291.1 | 0.22 |

Evaluation 1: Evaluation of Light Emission Output

Figure 4:
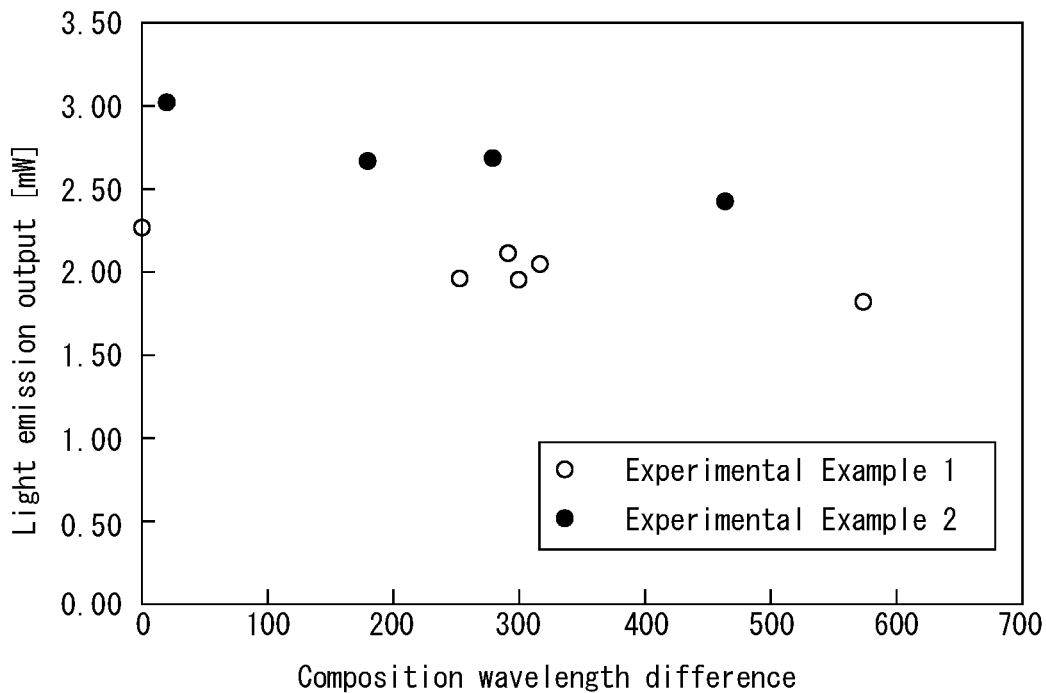
FIG. 4 is a graph comparing light emission output in examples.
Figure 5:
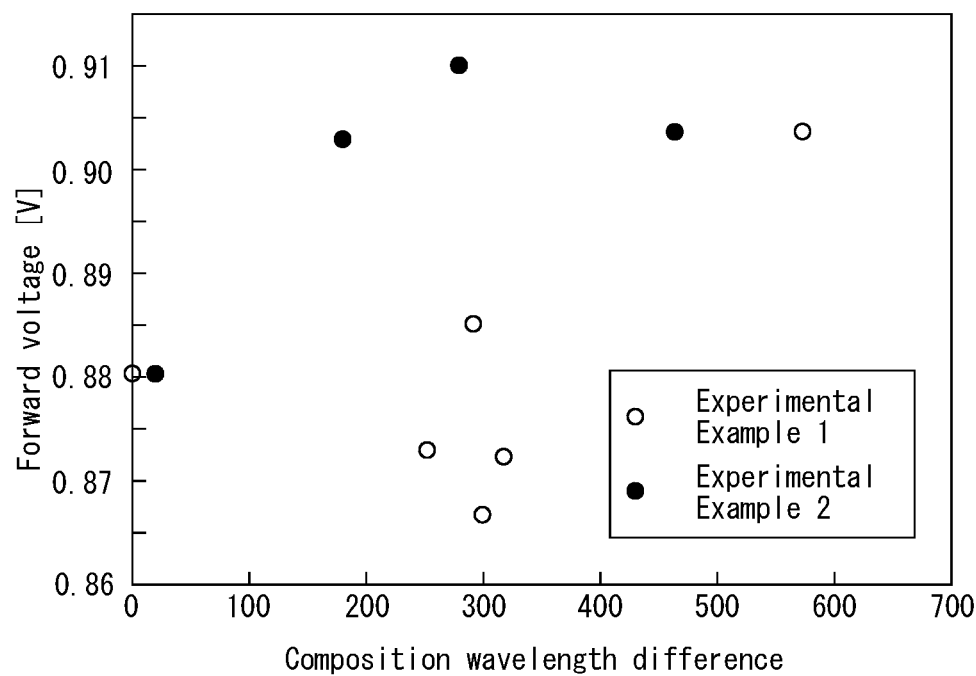
FIG. 5 is a graph comparing forward voltage in examples.

For each of the semiconductor light-emitting elements according to Examples 1 and 2 and Comparative Examples 1 to 8, the forward voltage Vf, the light emission output Po according to an integrating sphere, and the central emission wavelength λp were measured for when a 20 mA current was passed using a constant current/voltage power supply, and for each of these semiconductor light-emitting elements, an average value of measurement results for three samples was determined. The results are shown in Table 4. FIG. 4 illustrates a graph indicating a relationship of composition wavelength difference and light emission output Po. FIG. 5 illustrates a graph indicating a relationship of composition wavelength difference and forward voltage Vf.

Evaluation 2: Maintenance Rate of Light Emission Output

After measuring the initial light emission output according to an integrating sphere straight after semiconductor light-emitting element production (average for three samples), a 20 mA current was continuously passed through the semiconductor light-emitting element for 1,000 hours at room temperature, and then the light emission output according to an integrating sphere was measured again (average for three samples). The results are shown in Table 4.

TABLE 4

| | Composition wavelength difference [nm] | Lattice constant difference | Central emission wavelength λp [nm] | Light emission output Po [mW] | Forward voltage Vf [V] | Maintenance rate of light emission output |
|---|---|---|---|---|---|---|
| Example 1 | 19.2 | 0.41% | 1295.0 | 3.03 | 0.88 | 93.0% |
| Comparative Example 1 | 463.7 | 0.59% | 1277.0 | 2.43 | 0.90 | 92.0% |
| Comparative Example 2 | 278.6 | 0.46% | 1291.4 | 2.69 | 0.91 | 91.4% |
| Comparative Example 3 | 179.4 | 0.53% | 1315.3 | 2.67 | 0.90 | 92.3% |
| Example 2 | 0.6 | 0.36% | 1444.1 | 2.27 | 0.88 | 93.4% |
| Comparative Example 4 | 573.2 | 0.10% | 1478.8 | 1.83 | 0.90 | 92.7% |
| Comparative Example 5 | 299.5 | 0.22% | 1468.8 | 1.96 | 0.87 | 92.4% |
| Comparative Example 6 | 316.5 | 0.05% | 1470.2 | 2.05 | 0.87 | 92.5% |
| Comparative Example 7 | 252.4 | 0.41% | 1467.9 | 1.97 | 0.87 | 93.8% |
| Comparative Example 8 | 291.1 | 0.22% | 1430.9 | 2.12 | 0.89 | 92.0% |

It was confirmed through Table 4 and FIG. 4 that light emission output improves in a case in which a composition wavelength difference and a lattice constant difference in accordance with the disclosed conditions are satisfied. Moreover, with regards to forward voltage, it was confirmed through FIG. 5 that good values of a similar or better level than the comparative examples in each experimental example were obtained in each of Examples 1 and 2. Furthermore, with regards to the maintenance rate of light emission output, it was confirmed that good values of a similar or better level than the comparative examples in each experimental example were obtained in each of Examples 1 and 2.

REFERENCE SIGNS LIST

10 supporting substrate
20 intervening layer
30 first conductivity type semiconductor layer (n-type semiconductor layer)
41 first spacer layer
42 second spacer layer 50 light-emitting layer
51 first III-V compound semiconductor layer (first layer)
52 second III-V compound semiconductor layer (second layer)
53 third III-V compound semiconductor layer (third layer)
70 second conductivity type semiconductor layer (p-type semiconductor layer)
80 second electrode
90 first electrode
100 semiconductor light-emitting element

The invention claimed is:

1. A semiconductor light-emitting element comprising a light-emitting layer having a layered structure in which a first III-V compound semiconductor layer and a second III-V compound semiconductor layer having different composition ratios are stacked repeatedly, wherein
group III element in the first III-V compound semiconductor layer and the second III-V compound semiconductor layer is one type or two or more types selected from the group consisting of Al, Ga, and In, and group V element in the first III-V compound semiconductor layer and the second III-V compound semiconductor layer is one type or two or more types selected from the group consisting of As, Sb, and P,
the first III-V compound semiconductor layer and the second III-V compound semiconductor layer each contain three or more types of elements selected from the group III element and the group V element, and
a composition wavelength difference between a composition wavelength of the first III-V compound semiconductor layer and a composition wavelength of the second III-V compound semiconductor layer is 50 nm or less, and a ratio of a lattice constant difference between a lattice constant of the first III-V compound semiconductor layer and a lattice constant of the second III-V compound semiconductor layer is not less than 0.05% and not more than 0.60%.

2. The semiconductor light-emitting element according to claim 1, wherein the ratio of the lattice constant difference is 0.3% or more.

3. The semiconductor light-emitting element according to claim 1, wherein the composition wavelength difference between the first III-V compound semiconductor layer and the second III-V compound semiconductor layer is 30 nm or less.

4. The semiconductor light-emitting element according to claim 1, wherein the first III-V compound semiconductor layer and the second III-V compound semiconductor layer each contain four or more types of elements selected from the group III element and the group V element.

5. The semiconductor light-emitting element according to claim 4, wherein among elements constituting the four or more types of elements, the group III element is Ga and In and the group V element is two or more types selected from the group consisting of As, Sb, and P.

6. The semiconductor light-emitting element according to claim 1, wherein the first III-V compound semiconductor layer and the second III-V compound semiconductor layer are each an InGaAsP quaternary compound semiconductor.

7. The semiconductor light-emitting element according to claim 1, wherein
a third III-V compound semiconductor layer is further included between the first III-V compound semiconductor layer and the second III-V compound semiconductor layer in the layered structure of the light-emitting layer,
group III element in the third III-V compound semiconductor layer is one type or two or more types selected from the group consisting of Al, Ga, and In, and group V element in the third III-V compound semiconductor layer is one type or two or more types selected from the group consisting of As, Sb, and P,
the third III-V compound semiconductor layer contains four or more types of elements selected from the group III element and the group V element,
each composition wavelength difference between adjacent layers among the first III-V compound semiconductor layer, the second III-V compound semiconductor layer, and the third III-V compound semiconductor layer is 50 nm or less, and
each ratio of a lattice constant difference between adjacent layers among the first III-V compound semiconductor layer, the second III-V compound semiconductor layer, and the third III-V compound semiconductor layer is not less than 0.05% and not more than 0.60%.

8. The semiconductor light-emitting element according to claim 7, wherein the third III-V compound semiconductor layer is an InGaAsP quaternary compound semiconductor.

9. A method of producing the semiconductor light-emitting element according to claim 1, comprising:
a first step of forming the first III-V compound semiconductor layer;
a second step of forming the second III-V compound semiconductor layer; and
a light-emitting layer formation step of repeatedly performing the first step and the second step to form the light-emitting layer.

* * * * *